United States Patent
Meinel et al.

(10) Patent No.: US 8,114,779 B2
(45) Date of Patent: Feb. 14, 2012

(54) SILICON DIOXIDE CANTILEVER SUPPORT AND METHOD FOR SILICON ETCHED STRUCTURES

(75) Inventors: Walter B. Meinel, Tucson, AZ (US); Kalin V. Lazarov, Tucson, AZ (US); Brian E. Goodlin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/208,130

(22) Filed: Aug. 11, 2011

(65) Prior Publication Data

US 2011/0294246 A1 Dec. 1, 2011

Related U.S. Application Data

(63) Continuation of application No. 12/454,257, filed on May 14, 2009, now Pat. No. 8,026,177.

(51) Int. Cl.
*H01L 21/311* (2006.01)

(52) U.S. Cl. ........ 438/700; 438/424; 438/428; 438/436; 438/438

(58) Field of Classification Search .................. 438/700, 438/424, 428, 436, 438, 107
See application file for complete search history.

(56) References Cited

U.S. PATENT DOCUMENTS

2009/0250784 A1* 10/2009 Meinel et al. ................. 257/516

\* cited by examiner

*Primary Examiner* — Zandra Smith
*Assistant Examiner* — Telly Green
(74) *Attorney, Agent, or Firm* — John J. Patti; Wade J. Brady, III; Frederick J. Telecky, Jr.

(57) ABSTRACT

An apparatus includes a semiconductor layer (2) having therein a cavity (4). A dielectric layer (3) is formed on the semiconductor layer. A plurality of etchant openings (24) extend through the dielectric layer for passage of etchant for etching the cavity. An SiO2 pillar (25) extends from a bottom of the cavity to engage and support a portion of the dielectric layer extending over the cavity. In one embodiment, a cap layer (34) on the dielectric layer covers the etchant openings.

12 Claims, 18 Drawing Sheets

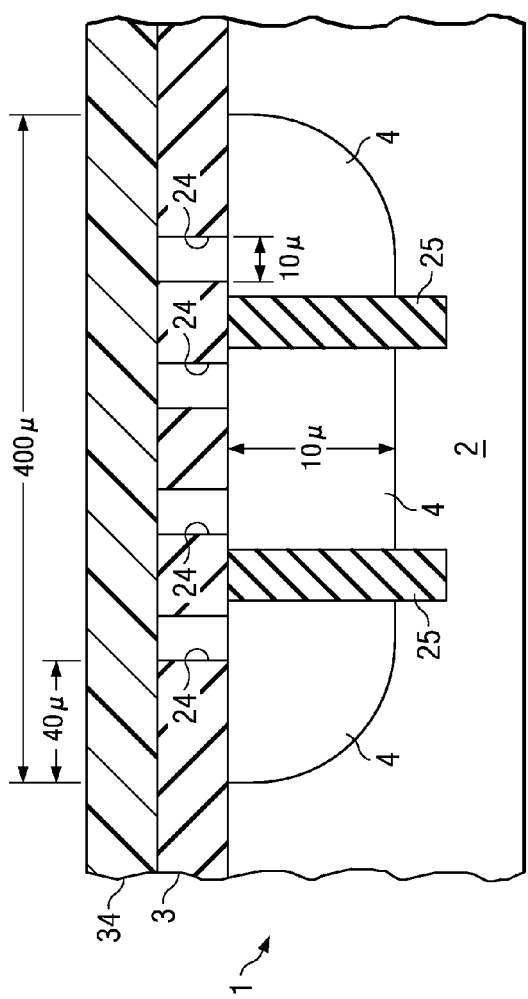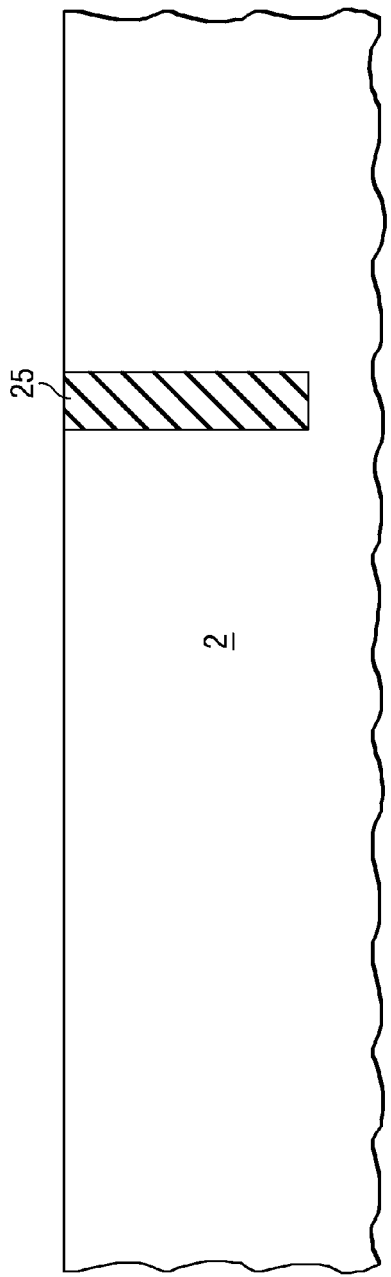

SILICON DIOXIDE CANTILEVER SUPPORT AND METHOD FOR SILICON ETCHED STRUCTURES

CROSS-REFERENCE TO RELATED APPLICATIONS

This application is a continuation that claims priority from U.S. patent application Ser. No. 12/454,257, filed May 14, 2009, which is hereby incorporated by reference for all purposes.

BACKGROUND

The present invention relates generally to structures and methods for strengthening/supporting dielectric membranes which extend over the over openings/cavities in integrated circuit devices, and more particularly to deep trench oxide post/support structures extending through openings/cavities to support various parts of the membranes.

This invention is related to the structures and methods disclosed in the assignee's pending application "INFRARED SENSOR STRUCTURE AND METHOD" by Walter B. Meinel and Kahn V. Lazarov, Ser. No. 12/380,316, filed Feb. 26, 2009, and incorporated herein by reference.

Integrated semiconductor sensors can make use of "cantilevered" silicon dioxide membrane structures which extend from, or "overhang" from, a silicon base or the like. Such membrane structures tend to be fragile and therefore susceptible to damage during assembly operations that occur after formation of the membrane structures. For example, to achieve maximum sensitivity, the cavity openings covered by the SiO2 membrane in the infrared sensors described in the above mentioned Meinel et al. application should be as large as possible. The larger the cavity opening is, the more fragile the SiO2 membrane will be.

The closest prior art is believed to include the article "Investigation Of Thermopile Using CMOS Compatible Process and Front-Side Si Bulk Etching" by Chen-Hsun-Du and Chengkuo Lee, Proceedings of SPIE Vol. 4176 (2000), pp. 168-178, incorporated herein by reference. Infrared thermopile sensor physics and measurement of IR radiation using thermopiles are described in detail in this reference. Prior Art FIG. 1A herein shows the CMOS-processing-compatible IR sensor integrated circuit chip in FIG. 1 of the foregoing article. "Prior Art" FIG. 1A herein is similar to that drawing, and Prior FIG. 1B herein shows the top perspective view of the same IR sensor integrated circuit chip illustrated in FIG. 2 of the foregoing article.

Referring to Prior Art FIG. 1A herein, the IR sensor chip includes a silicon substrate 2 having a CMOS-processing-compatible dielectric (SiO2) stack 3 thereon including a number of distinct sub-layers. A N-type polysilicon (polycrystalline silicon) trace 11 and an aluminum trace M1 in dielectric stack 3 form a first "thermopile junction" where one end of the polysilicon trace and one end of the aluminum trace are connected. Additional oxide layers and additional metal traces also may be included in dielectric stack 3. An oxide passivation layer 12A is formed on top of dielectric stack 3, and a nitride passivation layer 12B is formed on oxide passivation layer 12A. A number of silicon etchant openings 24 extend through nitride passivation layer 12 and dielectric stack 3 to the top surface of silicon substrate 2 and are used to etch a cavity 4 in silicon substrate 2 underneath the portion of dielectric stack 3 in which the thermopile is formed, to thermally isolate it from silicon substrate 2.

Prior Art FIG. 1A is taken along section line 1A-1A of Prior Art FIG. 1B, which is essentially similar to FIG. 2 of the above mentioned Du and Lee reference. Cavity 4 is etched underneath SiO2 stack 3 by means of silicon etchant introduced through the various etchant openings 24, which are relatively large and irregular. FIG. 1B shows various metal-polysilicon strips MP1 each of which includes an aluminum strip M1 and a polysilicon strip 11 which makes electrical contact to the aluminum strip M1 as shown in FIG. 1B. The metal strips M1 run parallel to the polysilicon strips 11 and, except for the electrical contact between them as shown in FIG. 1A, are separated from polysilicon strips 11 by a sub-layer of SiO2 stack 3. Although not shown in FIG. 1A, the dielectric material directly above metal strips M1 actually has corresponding steps which are indicated by reference numerals MP2 in FIG. 1B. The relatively large etchant openings 24 and their various angular shapes cause the "floating" membrane consisting of the various metal-polysilicon strips MP1 and the central section 3A of SiO2 stack 3 supported by metal-polysilicon strips MP1 to be very fragile. Such fragility ordinarily results in an unacceptably large number of device failures during subsequent wafer fabrication, subsequent packaging, and ultimate utilization of the IR sensor of FIGS. 1A and 1B.

A second thermopile junction (not shown) is also formed in dielectric stack 3 directly over a silicon substrate 2 and is not thermally isolated from silicon substrate 2, and therefore is at essentially the same temperature as silicon substrate 2. The first and second thermopile junctions are connected in series and form a single "thermopile". The various silicon etchant openings 24 are formed in regions in which there are no polysilicon or aluminum traces, as shown in the dark areas in FIG. 2 of the Du and Lee article.

Incoming IR radiation indicated by arrows 5 in Prior Art FIG. 1A impinges on the "front side" or "active surface" of the IR sensor chip. (The "back side" of the chip is the bottom surface of silicon substrate 2 as it appears in Prior Art FIG. 1A.) The incoming IR radiation 5 causes the temperature of the thermopile junction supported on the "floating" portion of dielectric membrane 3 located directly above cavity 4 to be greater than the temperature of the second thermopile junction (not shown) in dielectric membrane 3 which is not thermally insulated by cavity 4.

It is well-known that the upper limit of the operating frequency of an integrated circuit is often determined by the amount of parasitic capacitance associated with circuit elements such as resistors and/or capacitors and/or inductors therein. It would be very beneficial to be able to substantially lower such parasitic capacitance.

It would be highly desirable to provide integrated circuit devices which include fragile "cantilevered" dielectric membranes and which are more economical and more robust than those known in the prior art. It also would be highly desirable to provide robust integrated circuits that are operable at higher RF frequencies than previously have been economically achievable.

There is an unmet need for integrated circuit devices which include fragile "cantilevered" dielectric membranes and which are more robust than those known in the prior art.

There also is an unmet need for an IR radiation sensor which includes a fragile "cantilevered" dielectric membrane and which is more robust than those known in the prior art.

There also is an unmet need for a CMOS-processing-compatible IR radiation sensor chip which is substantially more robust than those of the prior art.

There also is an unmet need for an improved method of fabricating an IR radiation sensor.

There also is an unmet need for a robust, economical integrated circuit that is operable at higher RF frequencies than have been previously achievable for similar integrated circuits.

There also is an unmet need for a way of providing a circuit component having reduced parasitic capacitance in an integrated circuit.

There also is an unmet need for a way of providing a resistor and/or a capacitor and/or an inductor having reduced parasitic capacitance in an integrated circuit.

SUMMARY

It is an object of the invention to provide integrated circuit devices which include fragile "cantilevered" dielectric membranes and which are more robust than those known in the prior art.

It is another object of the invention to provide an IR radiation sensor which includes a fragile "cantilevered" dielectric membrane and which is more robust than IR radiation sensors known in the prior art.

It is another object of the invention to provide a more accurate IR radiation sensor which includes a fragile "cantilevered" dielectric membrane and which is more robust than those known in the prior art.

It is another object of the invention to provide a CMOS-processing-compatible IR radiation sensor chip which is substantially more robust than those of the prior art.

It is another object of the invention to provide an improved method of fabricating an IR radiation sensor.

It is another object of the invention to provide a robust, economical integrated circuit that is operable at higher RF frequencies that have been previously achievable in similar integrated circuits.

It is another object of the invention to provide a circuit component having reduced parasitic capacitance in an integrated circuit.

It is another object of the invention to provide a resistor and/or a capacitor and/or an inductor having reduced parasitic capacitance in an integrated circuit.

Briefly described, and in accordance with one embodiment, the present invention provides a semiconductor device including a semiconductor layer (2) having therein a cavity (4). A dielectric layer (3) is formed on the semiconductor layer. A plurality of etchant openings (24) extend through the dielectric layer for passage of etchant for etching the cavity. An SiO2 pillar (25) extends from a bottom of the cavity to engage and support a portion of the dielectric layer extending over the cavity. In one embodiment, a cap layer (34) on the dielectric layer covers the etchant openings.

In one embodiment, the invention provides a semiconductor device including a semiconductor layer (2), a dielectric layer (3) disposed on the semiconductor layer (2), and a portion of the semiconductor layer (2) extending over a cavity (4) in the semiconductor layer (2). A plurality of etchant openings (24) extend through the dielectric layer (3) for passage of etchant for etching the cavity (4). A pillar (25) of dielectric material extends from a bottom of the cavity (4) to engage and support the dielectric layer (3 of the portion of the dielectric layer (3) extending over the cavity (4), to thereby increase robustness of the semiconductor device. In a described embodiment, the pillar (25) is composed of SiO2, and the semiconductor layer (2) is composed of silicon. A cap layer (34) over the dielectric layer (3) covers the etchant openings (24). A passivation layer (12) is disposed on the dielectric layer (3), and the etchant openings (24) extend through the passivation layer (12. In a described embodiment, the cap layer (34) is composed of roll-on epoxy film in the passivation layer (12).

In a described embodiment, a first thermocouple junction (7) is included in a membrane portion of the dielectric layer (3) extending over the cavity (4), and a second thermocouple junction (8) is included in another portion of the dielectric layer (3) disposed directly on the semiconductor layer (2), the first (7) and second (8) thermocouple junctions being coupled to form a thermopile (7,8).

In another described embodiment, a passive component (87,88,94) is included in a membrane portion of the dielectric layer (3) extending over the cavity (4) to provide low parasitic capacitance associated with the passive component. Material, such as gas, in the cavity (4) has a low dielectric constant to provide the low parasitic capacitance. The passive component may include a resistor (87), a capacitor (88), and/or an inductor (94).

In one embodiment, the semiconductor layer (2) is disposed on a silicon-on-insulator (SOI) structure and the pillar (25) extends from the insulator thereof to the membrane portion of the dielectric layer (3).

In one embodiment, the invention provides a method for making a semiconductor device, including forming a deep trench in a semiconductor layer (2), filling the deep trench with SiO2 (25), providing a dielectric layer (3) on the semiconductor layer (2) and the SiO2 (25), forming a plurality of etchant openings (24) through the dielectric layer (3), the etchant openings (24) being proximate to the SiO2 (25), and introducing etchant through the etchant openings (24) to etch a cavity (4) in the semiconductor layer and thereby expose the SiO2 as a SiO2 pillar (25) extending from a bottom of the cavity (4) to engage and support a portion of the dielectric layer (3) extending over the cavity (4), to thereby increase robustness of the semiconductor device. In one embodiment, the method includes providing a cap layer (34) above the dielectric layer (3) to cover the etchant openings (24).

In a described embodiment, the invention includes providing a first thermocouple junction (7) in a portion of the dielectric layer (3) extending over the cavity (4), and providing a second thermocouple junction (8) in another portion of the dielectric layer (3) disposed directly on the semiconductor layer (2), and coupling the first (7) and second (8) thermocouple junctions to form a thermopile (7,8). In another described embodiment, the invention includes providing a passive component (87,88,94) in a portion of the dielectric layer (3) extending over the cavity (4) to provide low parasitic capacitance between the passive component and the semiconductor layer (2).

In one embodiment, the invention provides a semiconductor device including a semiconductor layer (2) having therein a cavity (4), a dielectric layer (3) on the semiconductor layer (2), a plurality of etchant openings (24) extending through the dielectric layer (3) for passage of etchant for etching the cavity (4), and support means (25) extending from a bottom of the cavity (4) for engaging and supporting a portion of the dielectric layer (3) extending over the cavity (4).

BRIEF DESCRIPTION OF THE DRAWINGS

For a more complete understanding of the present invention, and the advantages thereof, reference is now made to the following descriptions taken in conjunction with the accompanying drawings, in which:

FIG. 4 is a more generalized section view diagram of the IR sensor of FIG. 2A, indicating various minimum dimensions of one embodiment thereof.

FIGS. 5A-5I show a sequence of section view diagrams of the IR sensor of FIG. 3A or FIG. 3B as it is being fabricated.

DETAILED DESCRIPTION

Figure 1A:
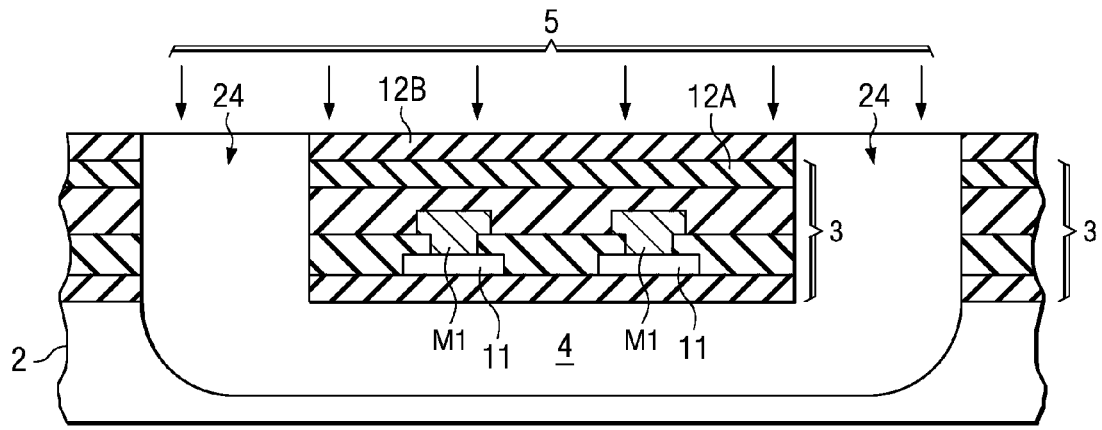
FIG. 1A is a section view diagram of a prior art IR radiation detector supported in a membrane formed in a CMOS-processing-compatible process, taken along section line 1A-1A of FIG. 1B.
Figure 1B:
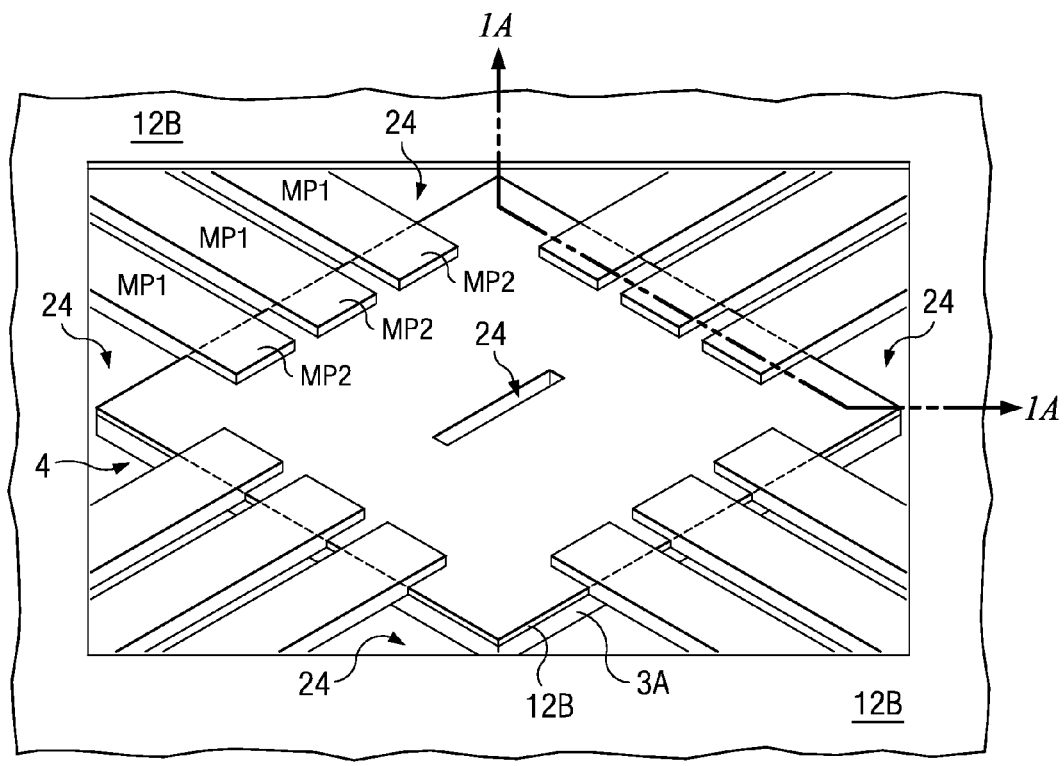
FIG. 1B is a top perspective view of the prior art IR radiation detector shown in FIG. 1A.
Figure 2A:
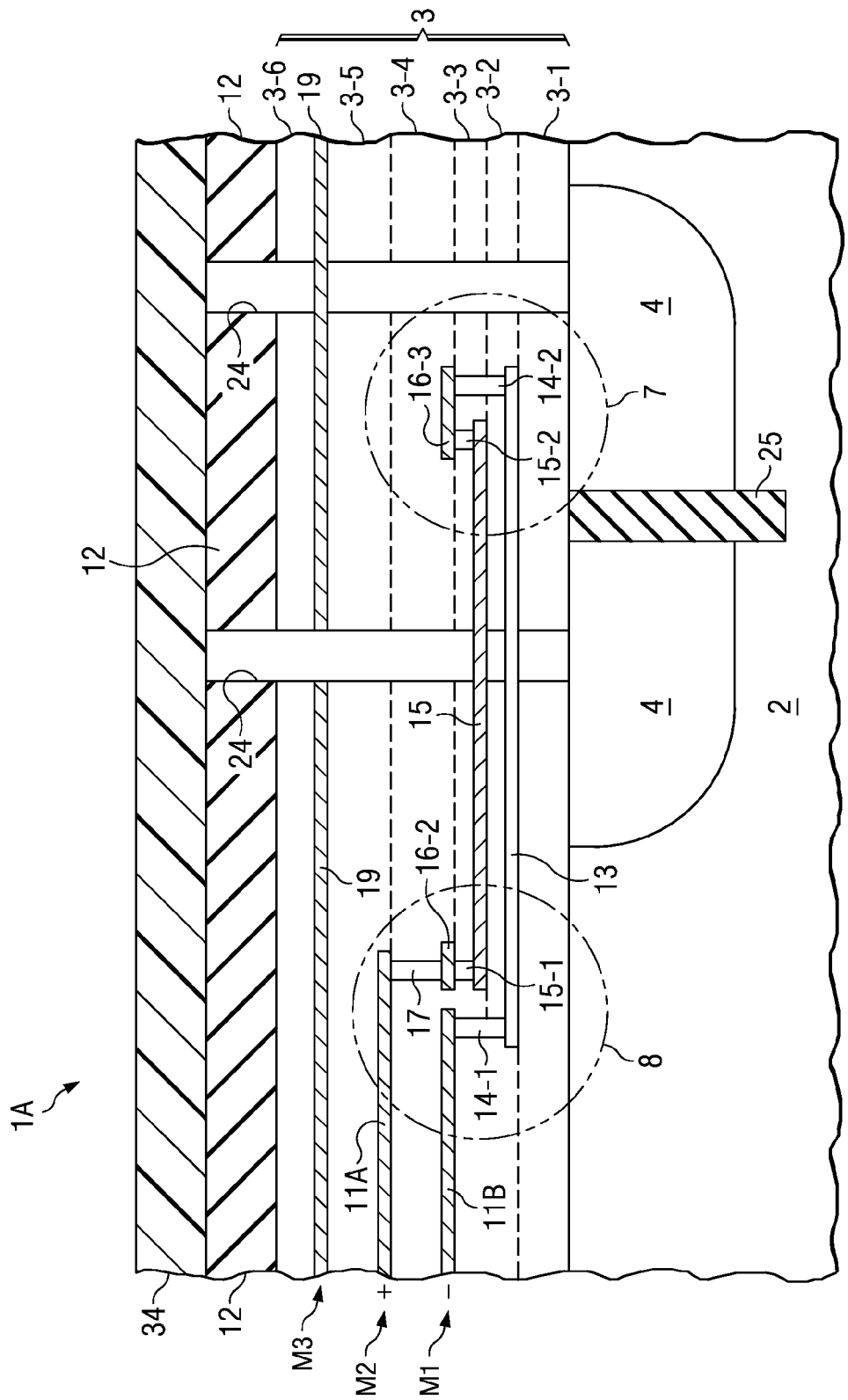
FIG. 2A is a section view of a CMOS-processing-compatible IR sensor chip according to the present invention.

The present invention provides one or more deep trench oxide pillars 25 to act as a support structure under a portion of a subsequently described SiO2 membrane which extends over a subsequently described cavity 4 etched in a silicon layer 2 (FIG. 2A). The deep trench oxide is strong and resistant to the silicon etching process and therefore the oxide pillar is exposed as the cavity is etched into the silicon layer. Ordinary forces on the top surface of the fragile SiO2 membrane therefore will not damage it. Consequently, the present invention makes it more feasible to use standard low cost packaging (WCSP) for the IR sensor disclosed in the above mentioned pending Meinel et al. application. As subsequently explained, the present invention also makes it more feasible to provide greatly reduced parasitic capacitances for resistors and/or capacitors and/or conductors in an integrated circuit.

FIG. 2A shows a cross-section of an integrated circuit IR sensor chip 1A which includes silicon substrate 2 and an etched cavity 4 therein. Silicon substrate 2 in FIG. 2A typically includes a thin layer (not shown) of epitaxial silicon into which cavity 4 is etched, and also includes a silicon wafer substrate on which the original epitaxial silicon layer is grown. IR sensor chip 1A includes dielectric stack 3 (also referred to as SiO2 stack 3) formed on the upper surface of silicon substrate 2. SiO2 stack 3 includes multiple oxide layers 3-1, 2 . . . 6 as required to facilitate fabrication of N-doped polysilicon (polycrystalline silicon) layer 13, titanium nitride layer 15, tungsten contact layers 14-1, 14-2, 15-1, 15-2, and 17, first aluminum metallization layer M1, second aluminum metallization layer M2, third aluminum metallization layer M3, and various elements of CMOS circuitry (not shown), all within SiO2 stack 3.

The various layers shown in dielectric stack 3, including polysilicon layer 13, titanium nitride layer 15, aluminum first metallization layer M1, aluminum second metallization layer M2, and aluminum third metallization layer M3, each are formed on a corresponding oxide sub-layer of dielectric stack 3. Thermopile 7,8 is formed within SiO2 stack 3. Cavity 4 in silicon substrate 2 is etched directly beneath thermopile junction 7, and therefore thermally insulates thermopile junction 7 from silicon substrate 2. However, thermopile junction 8 is located directly adjacent to silicon substrate 2 (and therefore is at essentially the same temperature as silicon substrate 2). A relatively long, narrow polysilicon trace 13 is disposed on a SiO2 sub-layer 3-1 of dielectric stack 3 and extends between tungsten contact 14-2 (in thermopile junction 7) and tungsten contact 14-1 (in thermopile junction 8). Titanium nitride trace 15 extends between tungsten contact 15-1 (in thermopile junction 8) and tungsten contact 15-2 (in thermopile junction 7). Thus, polysilicon trace 13 and titanium nitride trace 15 both function as parts of thermopile 7,8.

The right end of polysilicon layer 13 is connected to the right end of titanium nitride trace 15 by means of tungsten contact 14-2, aluminum trace 16-3, and tungsten contact 15-2 so as to form "hot" thermopile junction 7. Similarly, the left end of polysilicon layer 13 is connected by tungsten contact 14-1 to aluminum trace 11B and the left end of titanium nitride trace 15 is coupled by tungsten contact 15-1, aluminum trace 16-2, and tungsten contact 17 to aluminum trace 11A, so as to thereby form "cold" thermopile junction 8. The series-connected combination of the two thermopile junctions 7 and 8 forms thermopile 7,8.

Aluminum metallization interconnect layers M1, M2, and M3 are formed on the SiO2 sub-layers 3-3, 3-4, and 3-5, respectively, of dielectric stack 3. A conventional silicon nitride passivation layer 12 is formed on another oxide sub-layer 3-6 of dielectric layer 3. A number of relatively small-diameter etchant holes 24 extend from the top of passivation layer 12 through dielectric stack 3 to cavity 4, between the various patterned metallization (M1, M2 and M3), titanium nitride, and polysilicon traces which form thermopile junctions 7 and 8. As subsequently explained, silicon etchant is introduced through etchant holes 24 to etch cavity 4 into the upper surface of silicon substrate 2. Note, however, that providing the etchant openings 24 is not conventional in standard CMOS processing or bipolar integrated circuit processing, nor is the foregoing silicon etching conventionally used in this manner in standard CMOS processing or bipolar integrated circuit processing.

In accordance with the present invention, one or more "deep trench" SiO2 pillars 25 are provided within cavity 4, extending from the bottom of cavity 4 to engage and support the bottom of the portion of dielectric membrane 3 extending over cavity 4. The method of forming SiO2 pillars 25 is subsequently described.

The small diameters of round etchant holes 24 are selected in order to provide a more robust floating thermopile membrane, and hence a more robust IR radiation sensor. The diameters of the etchant hole openings 24 may vary from 10 microns to 30 microns with a spacing ratio of 3:1 maximum to 1:1. The spacings between the various etchant openings 24 may be in a range from approximately 10 to 60 microns. A smaller spacing ratio (i.e., the distance between the edges of the holes divided by the diameter of the holes) has the disadvantage that it results in lower total thermopile responsivity, due to the packing factor (the number of thermopile junctions per square millimeter of surface area) of the many thermopile junctions of which thermopile junctions 7 and 8 are composed, respectively. However, a smaller spacing ratio results in a substantially faster silicon etching time. Therefore, there is a trade-off between the robustness of the membrane and the cost of etching of cavity 4. The use of SiO2 pillars 25 in accordance with the present invention allows the use of larger spacing between the etchant openings 24, due to the additional membrane robustness achieved by use of SiO2 pillars 25. The use of SiO2 pillars 25 also allows the maximum size of cavity 4 to be increased.

Figure 2B:
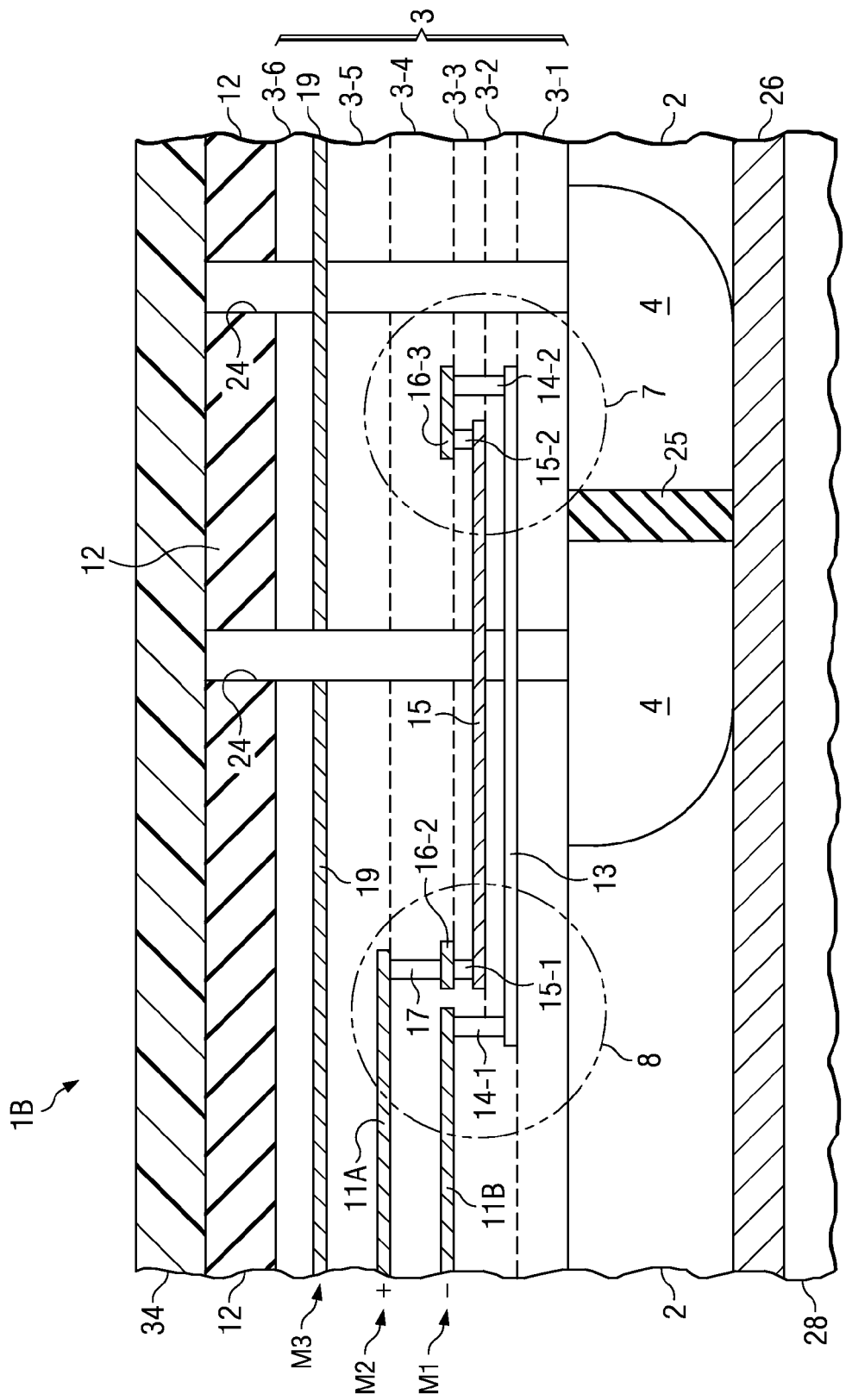
FIG. 2B is a section view of a CMOS-processing-compatible IR sensor chip according to the present invention, formed on an SOI (silicon-on-insulator) substrate.

The IR sensor 1B shown in FIG. 2B is the same as the IR sensor 1A shown in FIG. 2A except that the structure 1B in FIG. 2B is formed on an SOI (silicon-on-insulator) substrate structure instead of on a thick silicon wafer substrate. SOI technology is well-known and therefore is not described in detail, except to note that in FIG. 2B the silicon layer 2 is supported on an insulative layer 26 which provided on a suitable substrate 28. Cavity 4 is etched through silicon layer 2 all the way to the top surface of insulative layer 26, exposing the previously deposited SiO2 material into a deep trench in silicon layer 2. SiO2 pillar 25 extends from the upper surface of insulative layer 26 to the top surface of silicon layer 2, as subsequently described in more detail.

A roll-on epoxy film 34 may be provided on nitride passivation layer 12 to permanently seal the upper ends of etch openings 24 and to help reinforce the "floating membrane" portion of dielectric layer 3. However, the increased robustness of the membrane portion of SiO2 stack 3 over cavity 4 achieved by use of SiO2 pillars 25 may allow epoxy film 34 to be omitted in certain applications. In some applications, a thinner epoxy film 34 might be used. Although there may be some applications of the invention which do not require epoxy cover plate 34, the use of epoxy cover plate 34 may be an important aspect of providing a reliable WCSP package configuration of the IR sensors of the present invention. In an embodiment of the invention under development, epoxy cover plate 34 is substantially thicker (roughly 16 microns) than the entire thickness (roughly 6 microns) of dielectric stack 3.

Figure 3:
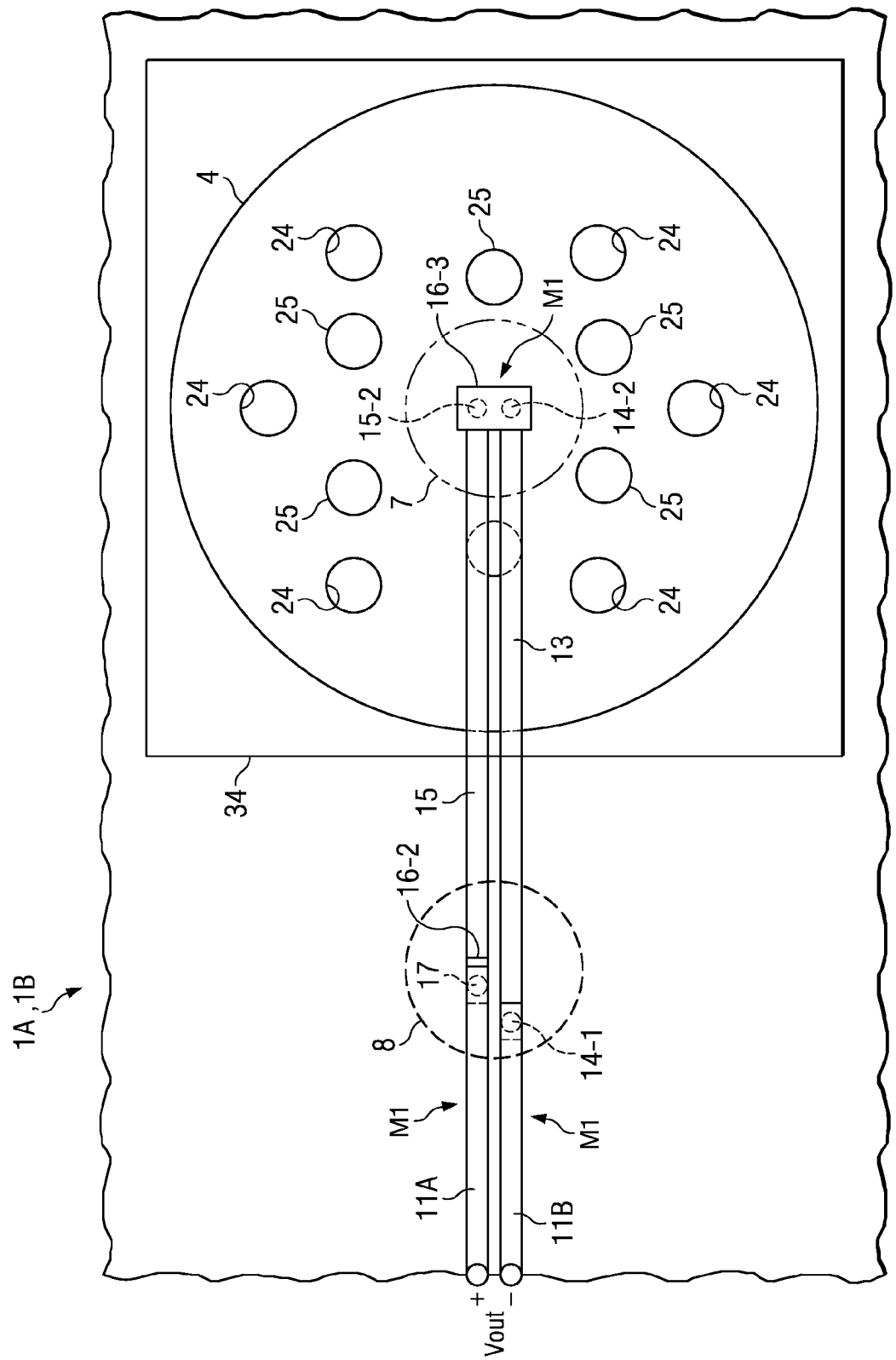
FIG. 3 is a transparent plan view of the IR sensor chip shown in FIG. 2A showing the relative alignment of various parts therein.

FIG. 3 shows an approximate "transparent" plan view of the portions of the IR sensors 1A and 1B shown in FIGS. 2A and 2B, respectively, to illustrate the relative locations of a number of the SiO2 pillars 25, a number of the etchant openings 24, thermopile junction 7, and thermopile junction 8. In this example, six SiO2 pillars 25 are symmetrically located around thermopile junction 7, extending from the bottom of cavity 4 to six corresponding areas of the bottom surface of dielectric layer 3. Typically, it would be more convenient to apply cover plate 34 to the entire top surface of passivation layer 12, although it could be applied to cover just the area above cavity 4 as shown in subsequently described FIG. 6A.

FIG. 4 illustrates minimum dimensions, in microns, of the various features of cavity 4 and the "floating" membrane portion of dielectric layer 3 which supports thermopile junction 7 above cavity 4 for an embodiment of the invention presently under development. In that embodiment the etchant openings 24 are at least 10 microns (μ) in diameter and are spaced at least approximately 10 microns apart. The span of cavity 4 is typically 400 microns, and its depth is at least 10 microns. The diameters of SiO2 pillars 25 are at least 0.5 microns in diameter, and are spaced at least 10 microns from any of etchant openings 24 and at least 10 microns from thermopile junction 7.

The differential voltage Vout generated between (−) conductor 11B and (+) conductor 11A can be applied to the input of CMOS circuitry (not shown).

The presence of cover plate 34 in FIGS. 2A and 2B, the thickness of which may be comparable to or greater than the thickness of dielectric layer 3, further strengthens the floating membrane portion of dielectric stack 3. SiO2 pillars 25 prevent deflection of points of SiO2 membrane 3 supported by SiO2 pillars 25. This reduces the total deflection of SiO2 membrane 3 and therefore reduces the associated stresses therein when various forces, e.g. due to subsequent fabrication steps, are applied to SiO2 membrane 3 over cavity 4.

Figure 5B:
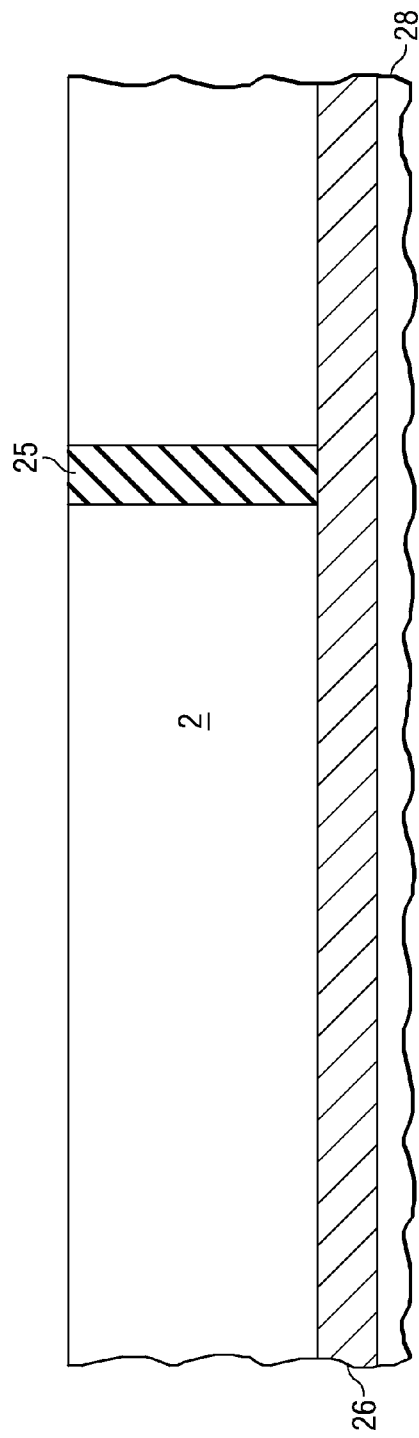

FIGS. 5A-5I show a sequence of section view diagrams of the IR sensor structures generated according to the process for fabricating the IR sensor chips of FIGS. 2A and 2B. FIG. 5A shows a "deep trench SiO2 pillar" 25 formed by etching a deep trench in silicon layer 2 in a conventional manner and then depositing SiO2 to fill the trench. The deposited SiO2 eventually becomes SiO2 pillar 25.

Essentially the same procedure can be performed if silicon layer 2 is supported on a SOI layer 26 which in turn is supported on a suitable substrate 28, as shown in FIG. 5B wherein the deep trench is etched all the way through silicon layer 2 so that SiO2 pillar 25 extends all the way to down SOI insulating layer 26. An advantage of using SOI layer 26 is that it defines a specific cavity depth which can be easily controlled by timing of the silicon etching process.

Figure 5C:
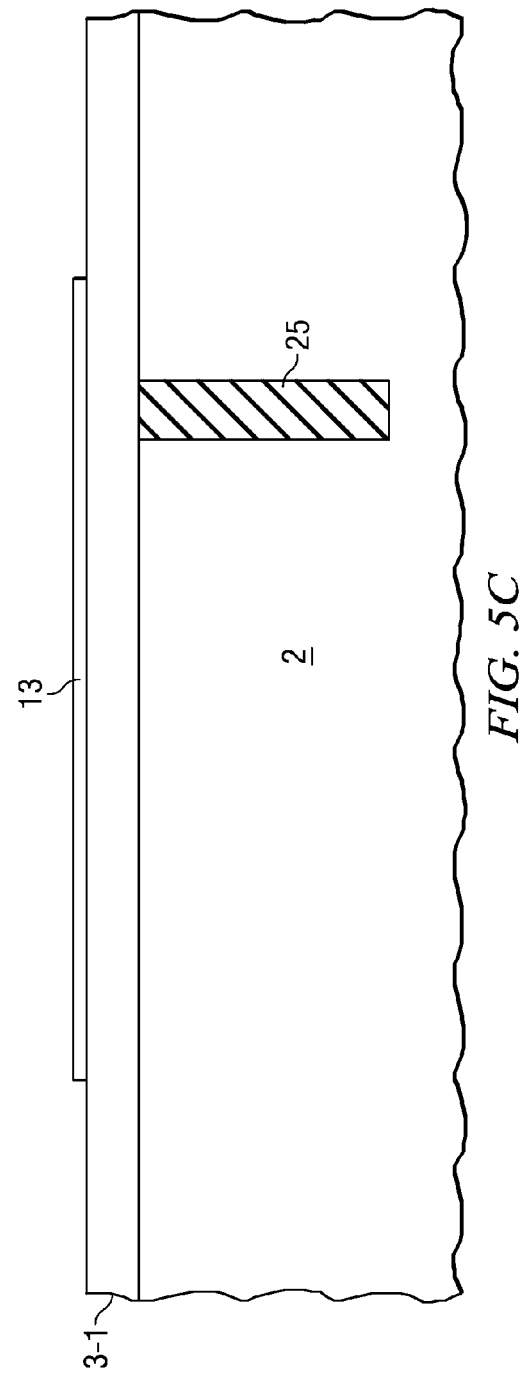
Figure 5D:
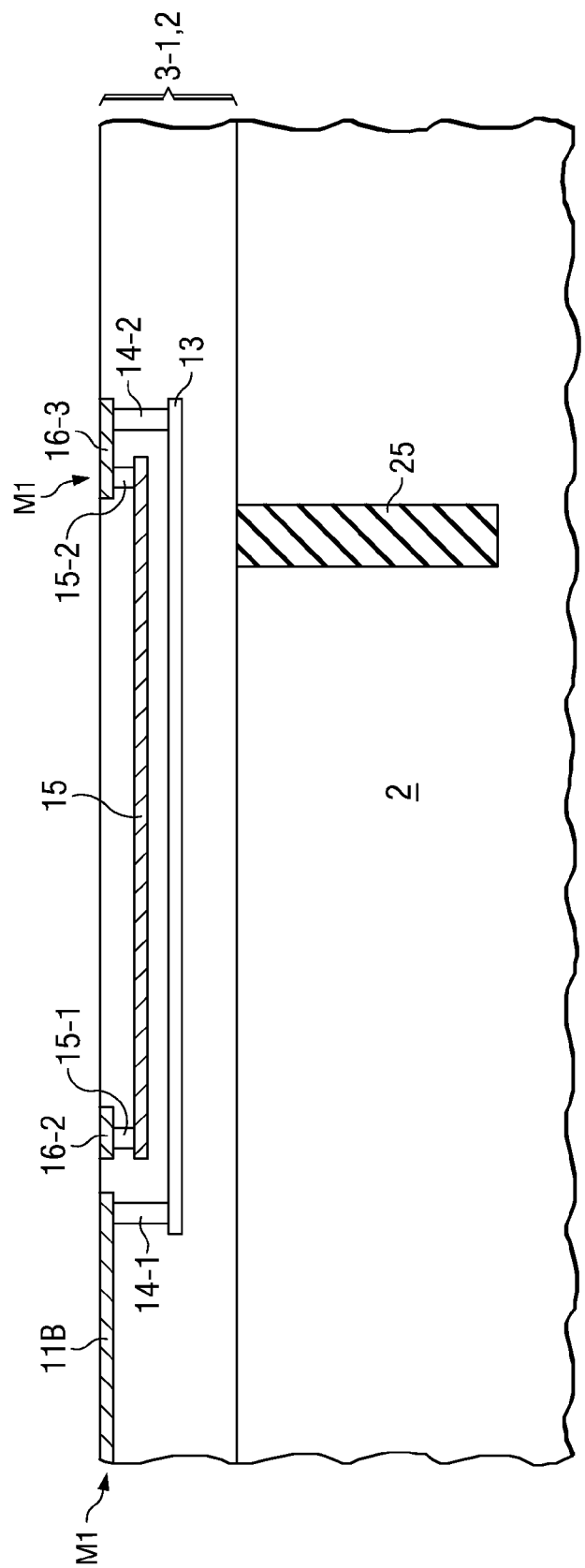

FIG. 5C shows providing an SiO2 layer 3-1 of dielectric layer 3 on the upper surface of silicon substrate 2 in either FIG. 5A or FIG. 5B, and then depositing a layer of polysilicon on the upper surface of SiO2 sublayer 3-1 (see FIGS. 2A and 2B). The layer of polysilicon then is patterned so as to provide the polysilicon trace 13 required to fabricate thermopile 7,8. Then, as indicated in FIG. 5D, another SiO2 sub-layer (see sub-layer 3-2 in FIGS. 2A and 2B) is deposited on the polysilicon traces 13, and then titanium nitride layer 15 is deposited on that sublayer and then patterned to provide the titanium nitride trace 15 as required to make thermopile 7,8. Then suitable via openings are provided through the SiO2 sub-layers 3-2 and 3-3 and conventional tungsten contacts are formed in the via openings. Next, a first metallization layer M1, which may be aluminum, is deposited on the SiO2 sub-layer 3-2 and patterned as needed to provide connection to the tungsten contacts and any CMOS circuitry (not shown) that is also being formed on infrared sensor chip 1.

Figure 5E:
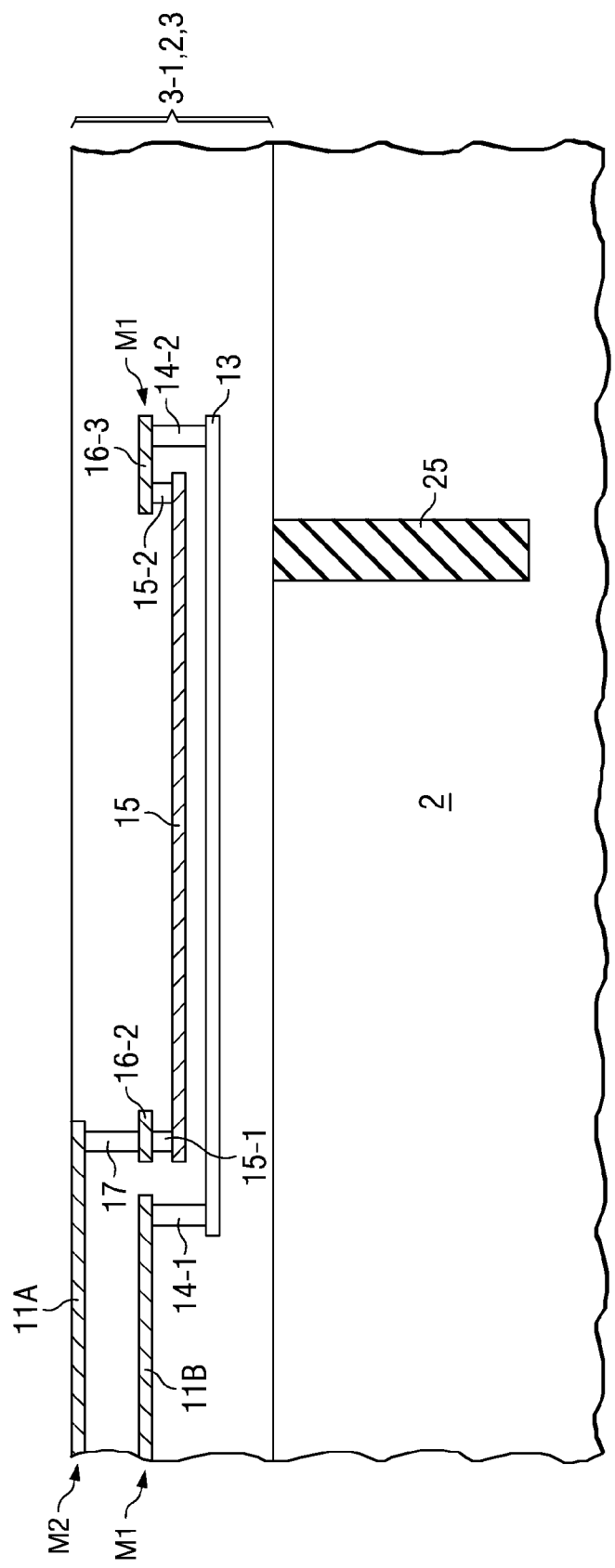
Figure 5F:
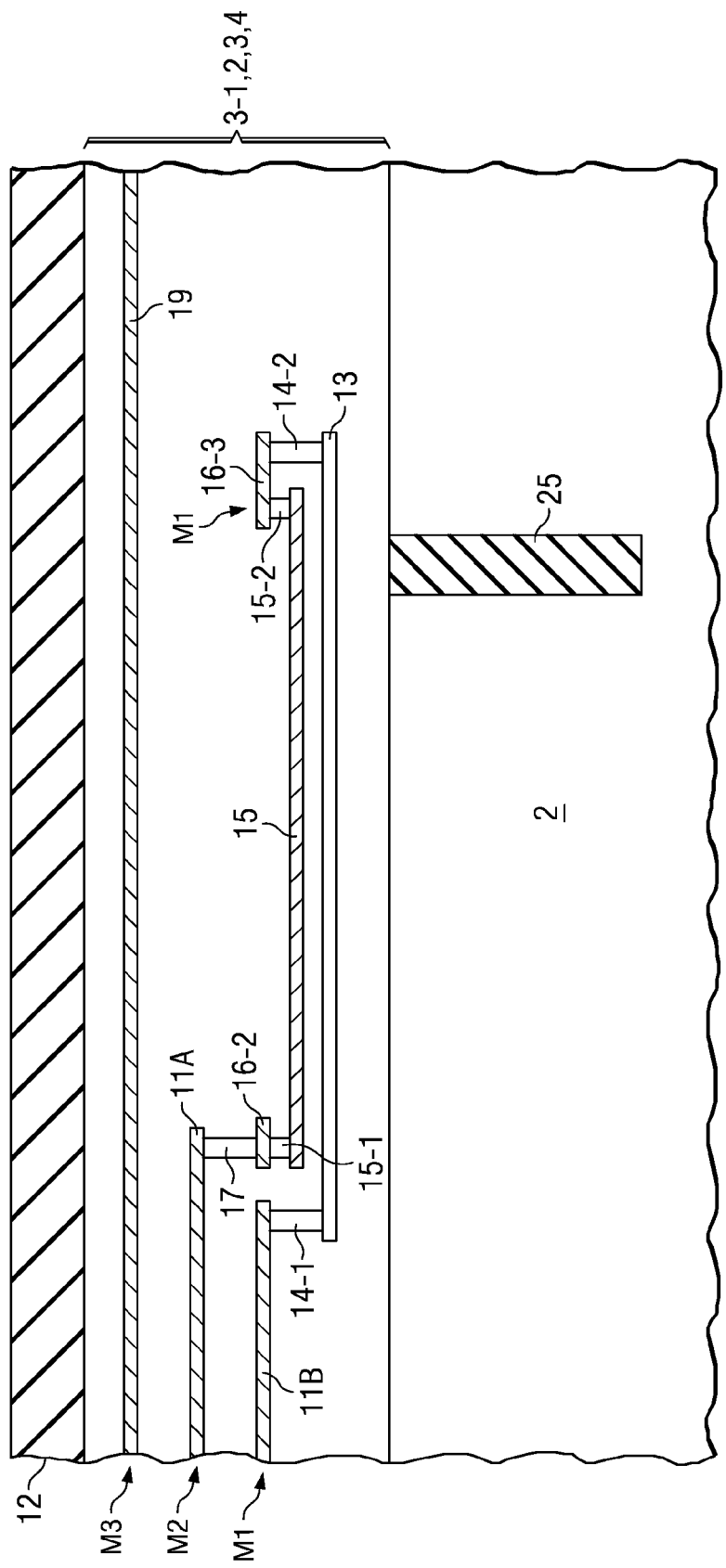

Then, as indicated in FIG. 5E, another SiO2 sub-layer 3-4 (see FIGS. 2A and 2B) is deposited on the first metallization M1. Suitable via openings then are formed in SiO2 sublayer 3-4, and tungsten vias are formed in those openings. Then a second aluminum metallization layer M2 is deposited on SiO2 sub-layer 3-4 and patterned as necessary to complete the formation of thermopile 7,8 and also to make connections that are required for any CMOS circuitry (not shown) also being formed on the integrated circuit chip. Next, as indicated in FIG. 5F, another SiO2 sub-layer 3-5 is deposited on the aluminum metallization M2. A third aluminum metallization layer M3, designated by reference numeral 19, is formed on sub-layer 3-5 and patterned as needed. Then a final SiO2 sub-layer 3-6 is deposited on the M3 metallization to complete the structure of SiO2 dielectric stack 3. Then, a silicon nitride passivation layer 12 is formed on dielectric sub-layer 3-6 (see FIGS. 2A and 2B).

Figure 5G:
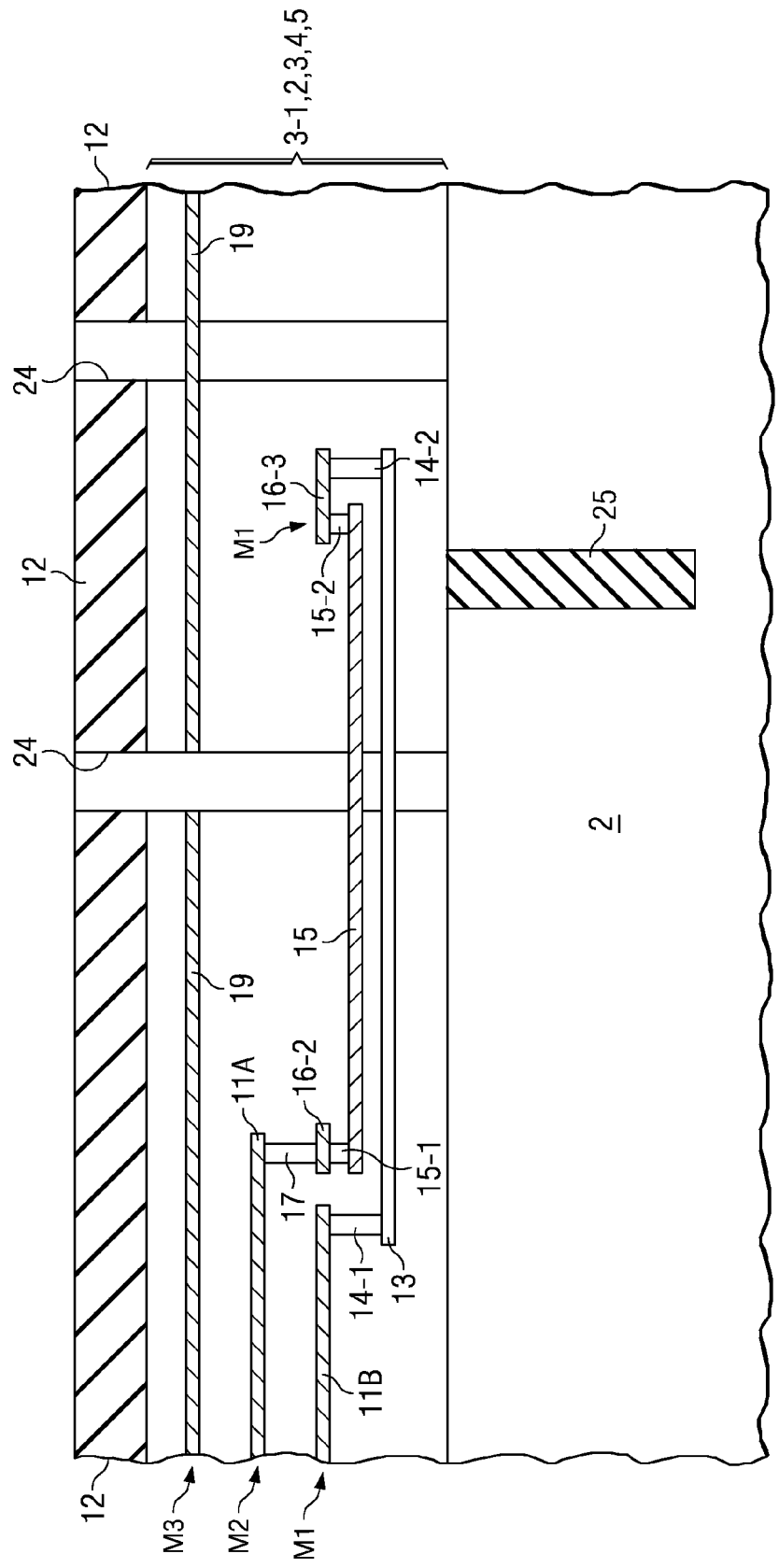
Figure 5H:
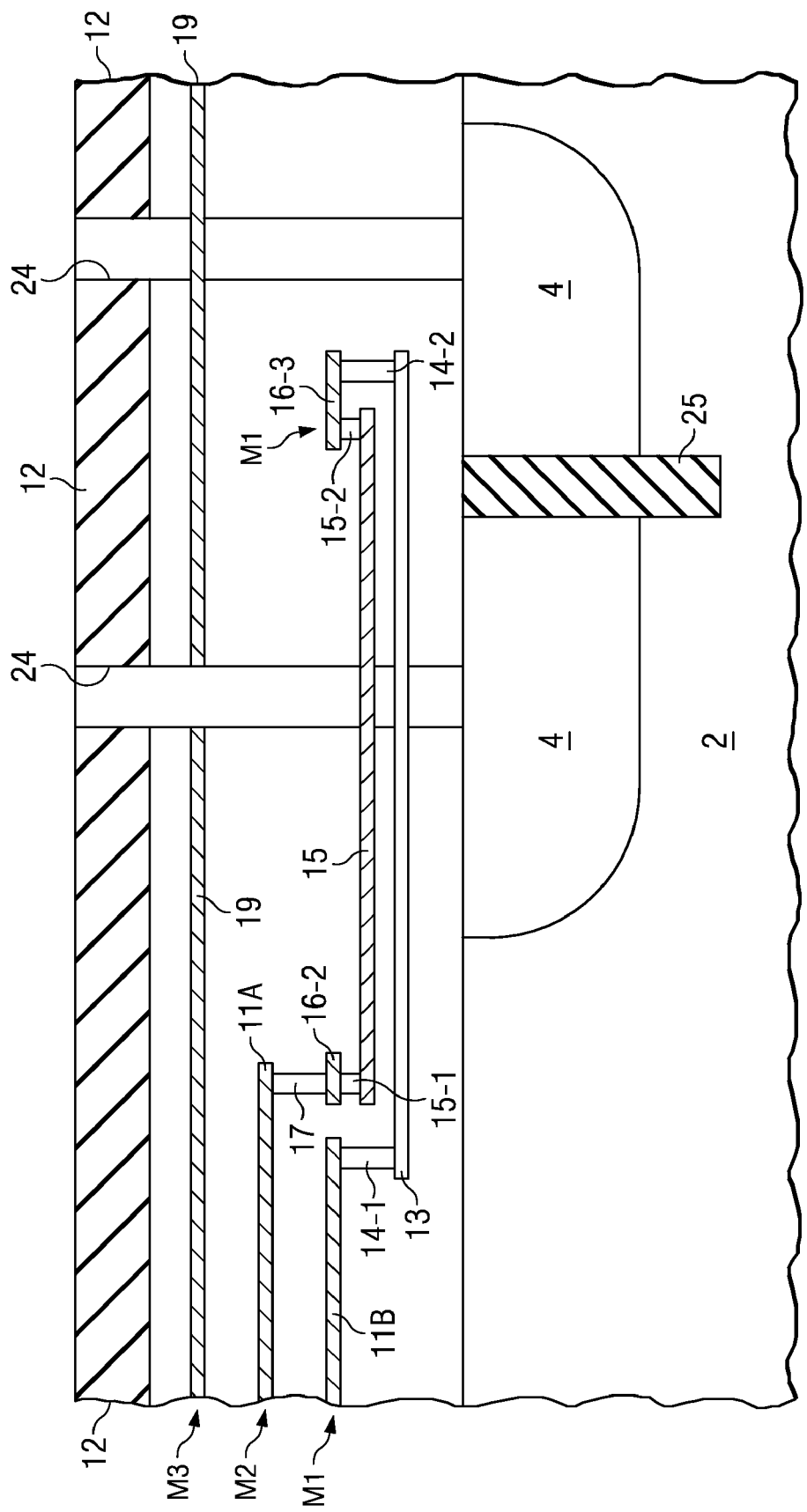

Next, as indicated in FIG. 5G, silicon etchant openings 24 are formed, extending from the upper surface of silicon substrate 2 to the top surface of passivation layer 12. Then, as indicated in FIG. 5H, a conventional isotropic silicon etchant is introduced into etchant openings 24 in order to etch cavity 4 in the upper surface of silicon substrate 2 so that cavity 4 has a shape determined by the locations of the various etchant openings 24. Since the silicon etchant used to etch cavity 4 does not attack SiO2, more and more of the SiO2 material 25 is exposed as the silicon etching progresses. Therefore, after cavity 4 has been completely etched, deep trench SiO2 pillar 25 extends from the bottom of cavity 4 all the way up to engage the bottom of dielectric layer 3. The portion of thin dielectric stack 3 extending over cavity 4 and containing etchant openings 24 and thermopile junction 7 thus becomes a more robust "floating" thermopile membrane which is thermally isolated by cavity 4 from silicon substrate 2.

Figure 5I:
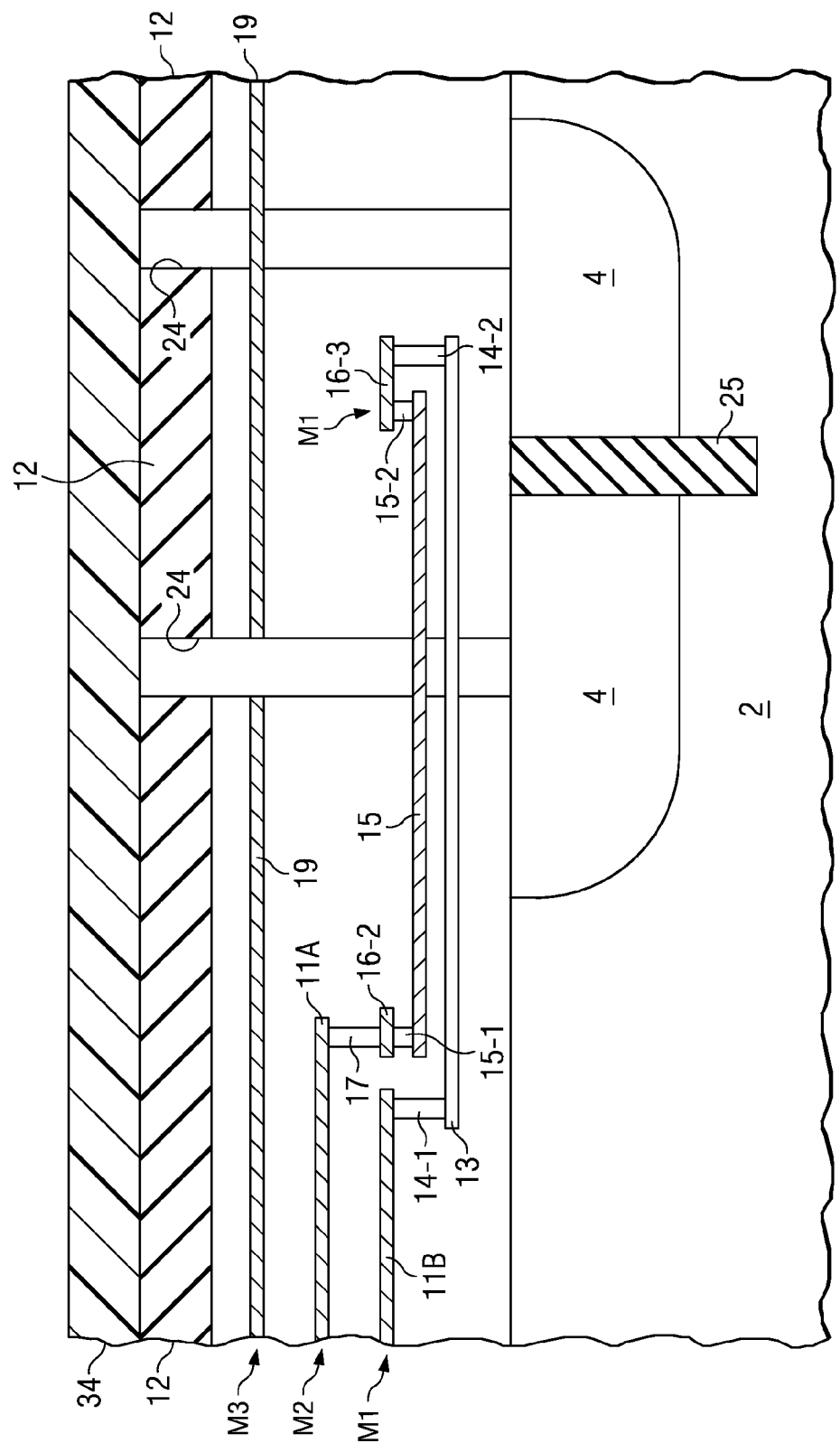

Finally, as indicated in FIG. 5I, a relatively thick roll-on epoxy film or other suitable permanent cap layer 34 is provided on at least part of the upper surface of silicon nitride passivation layer 12 in order to permanently seal cavity 4 and etchant openings 24 and also, in some cases, to substantially strengthen the "floating" portion of dielectric membrane 3. This is desirable because a very vigorous water stream may impinge on the surface of IR sensor chip 1 during subsequent wafer sawing operations and would tend to crush the "floating" thermopile membrane over cavity 4. Cap layer 34 also prevents silicon residue generated by the wafer sawing operations from entering cavity 4.

The size, shape, spacing between, and number of etchant openings 24 may be selected to optimize the strength of the "floating" thermopile membrane above cavity 4, so as to provide a more robust IR radiation sensor device. The improvement in membrane strength is inversely proportional to the decrease in distance or span between SiO2 pillars 25. (For example, if the span is reduced by a factor of 2, the membrane strength is doubled. The number and spacing of SiO2 pillars 25 will be determined by the amount of thermal conductance allowable for an IR sensing device, or by the allowable substrate capacitance (e.g., substrate capacitance of a resistor, capacitor, and/or inductor) for high frequency applications. Epoxy cover plate 34 preferably is placed over at least the IR sensor to seal cavity 4 and strengthen the floating membrane portion of dielectric layer 3 containing thermopile junction 7.

Figure 6A:
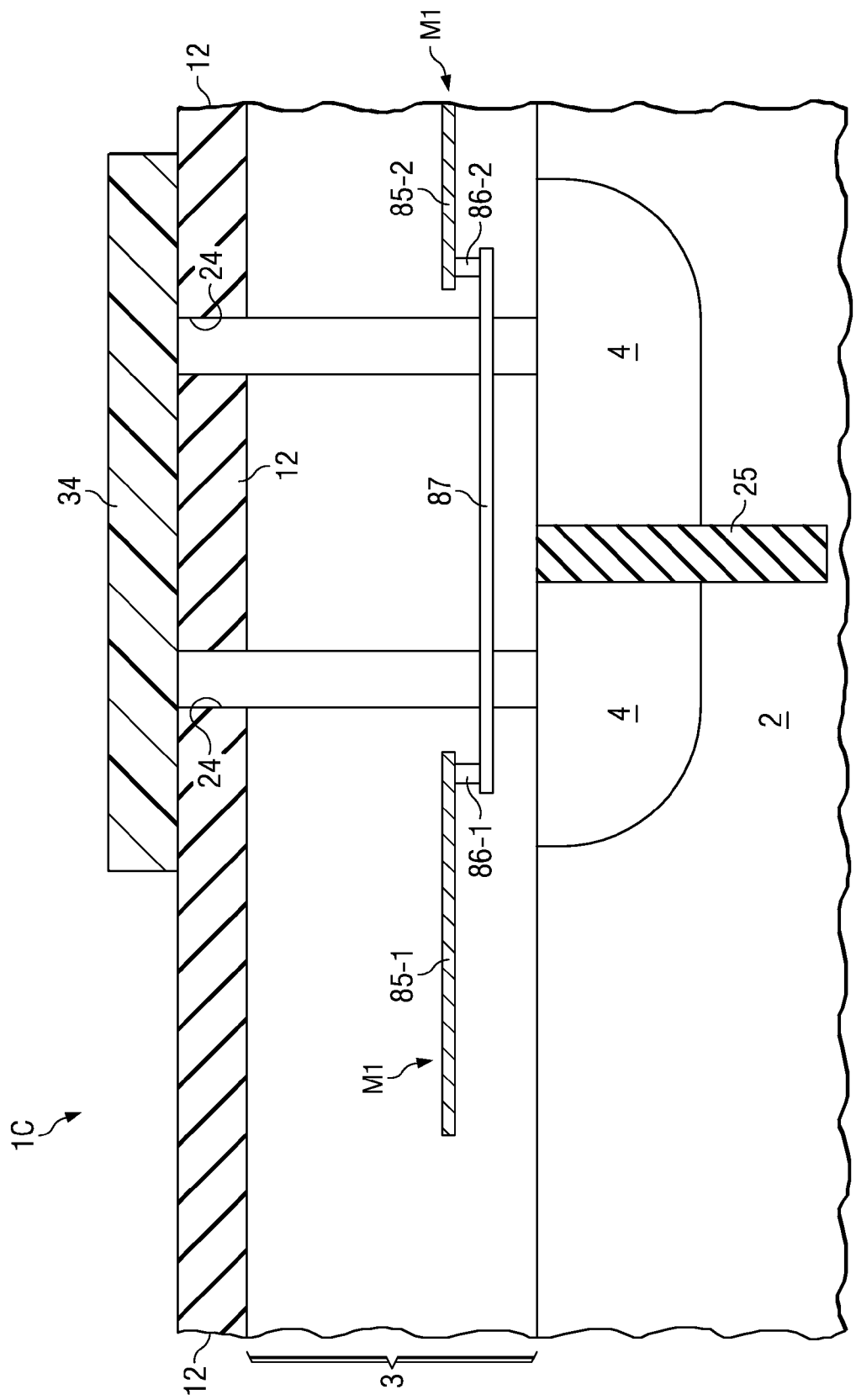
FIG. 6A is a section view of an integrated circuit of the present invention including a polycrystalline silicon resistor having very low resistor-to-substrate parasitic capacitance.
Figure 6B:
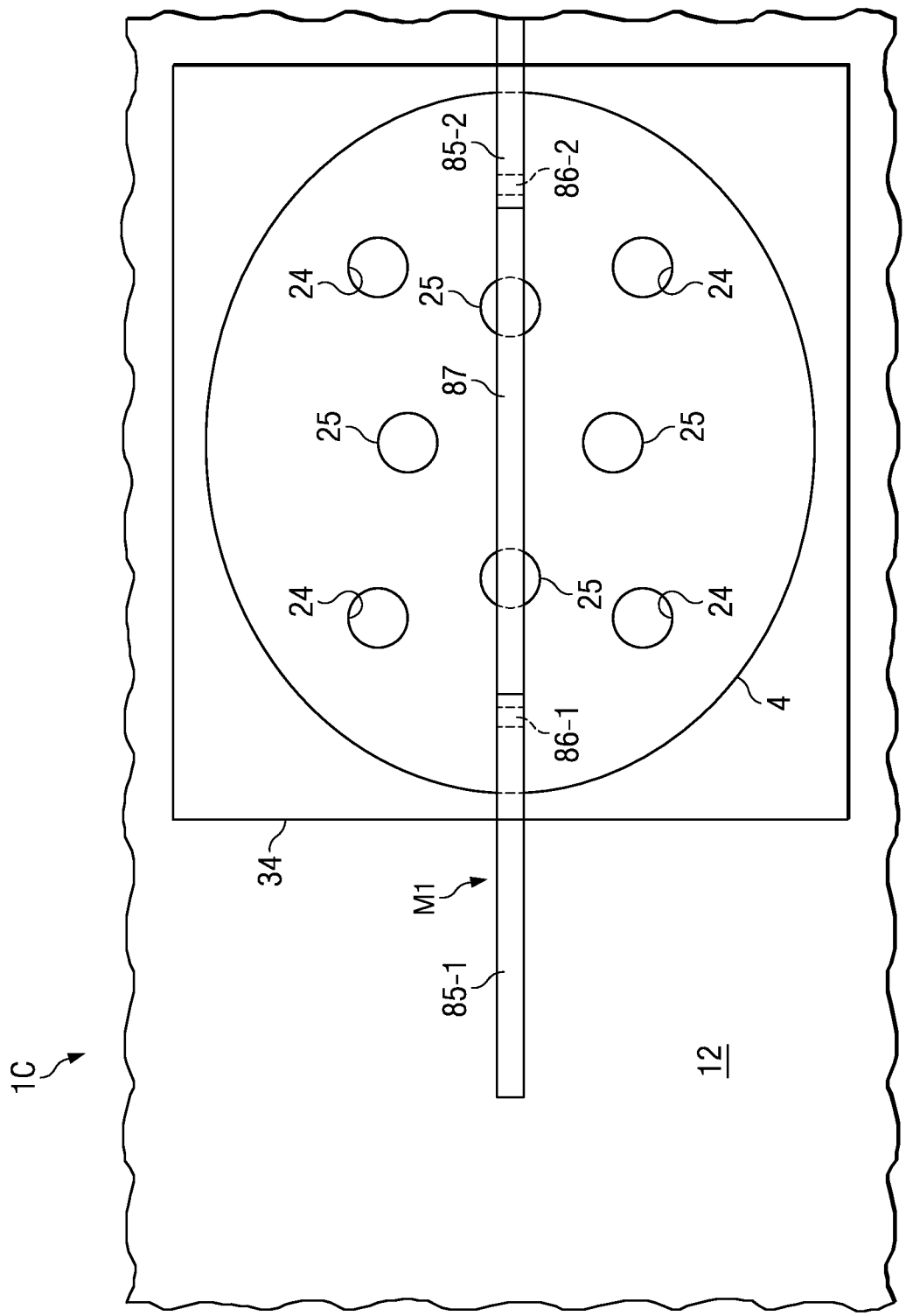
FIG. 6B is a transparent plan view of the integrated circuit shown in FIG. 6A showing the relative alignment of various parts therein.

FIGS. 6A and 6B show simplified section view and plan view diagrams, respectively, of an embodiment of the present invention wherein the parasitic capacitance between a polysilicon resistor 87 and an epitaxial silicon layer or substrate 2 of an integrated circuit chip 1C is greatly reduced by providing cavity 4 in silicon layer 2 directly underneath resistor 87. In FIGS. 6A and 6B, silicon layer 2, cavity 4, SiO2 pillar 25, a dielectric layer 3, passivation layer 12, etchant openings 24, and cover plate 34 may be substantially the same as in above described FIGS. 2A and 3 except that thermopile junctions 7 and 8 are omitted and instead an aluminum conductor 85-1 of the M1 metallization layer is connected by a tungsten contact 86-1 to one end of resistor 87 located directly above cavity 4. The other end of resistor 87 is connected by tungsten contact 86-2 to aluminum conductor 85-2 of the M1 metallization layer.

Since cavity 4 is filled with gas or other material having a much lower dielectric constant than SiO2, the parasitic resistor-to-substrate capacitance between resistor 87 and substrate 2 is much lower than would be the case if cavity 4 were not provided between resistor 87 and silicon substrate 2. RF circuitry (not shown) containing polysilicon silicon resistor 87 therefore may be operable at much higher frequency than if cavity 4 is not present (if the parasitic capacitance is the factor which actually limits the maximum RF frequency). As in the case of FIGS. 2A and 2B, the presence of SiO2 pillars 25 results in a much stronger, more robust SiO2 membrane extending over cavity 4.

Figure 7A:
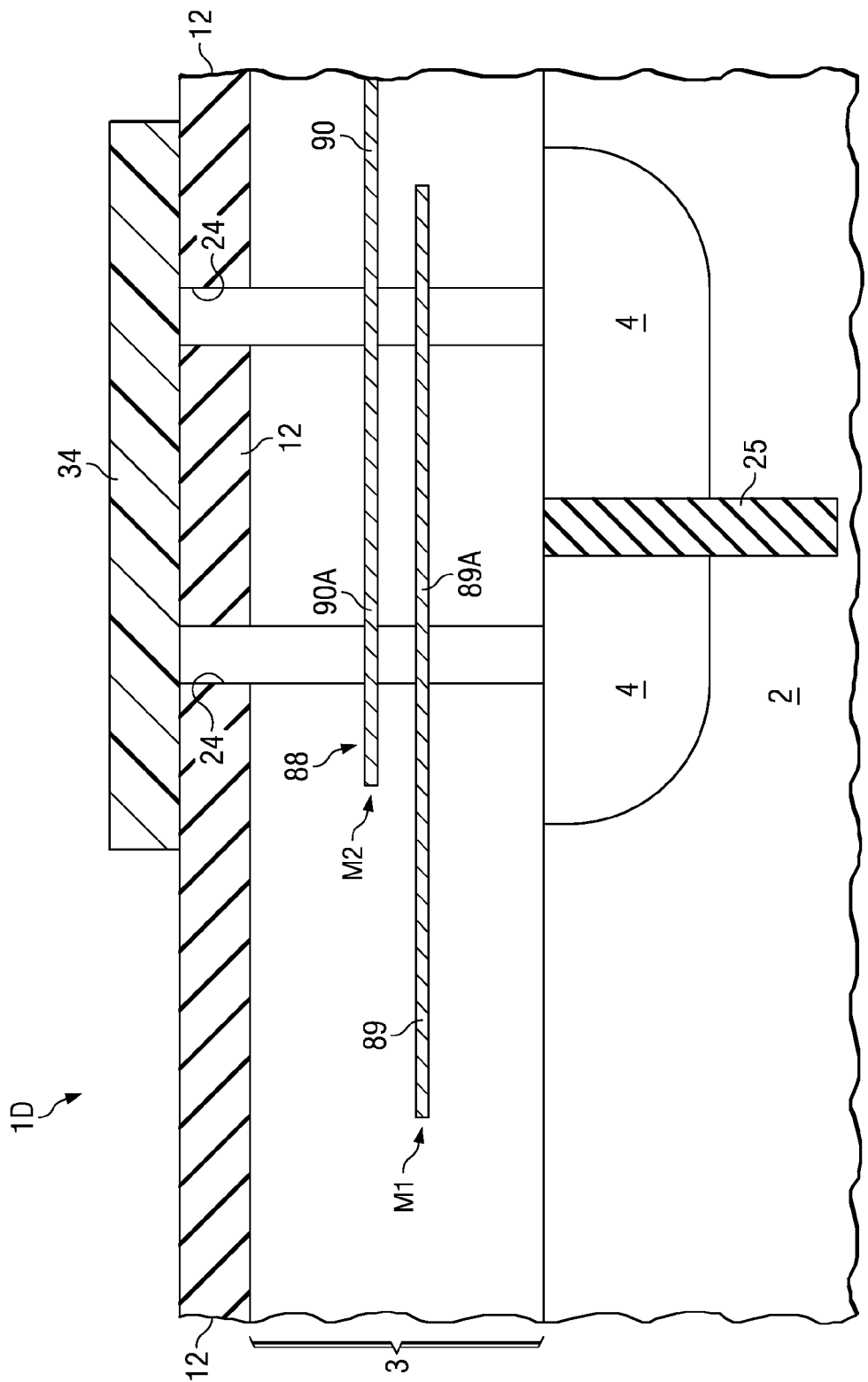
FIG. 7A is a section view of an integrated circuit of the present invention including a capacitor having very low capacitor-to-substrate parasitic capacitance.
Figure 7B:
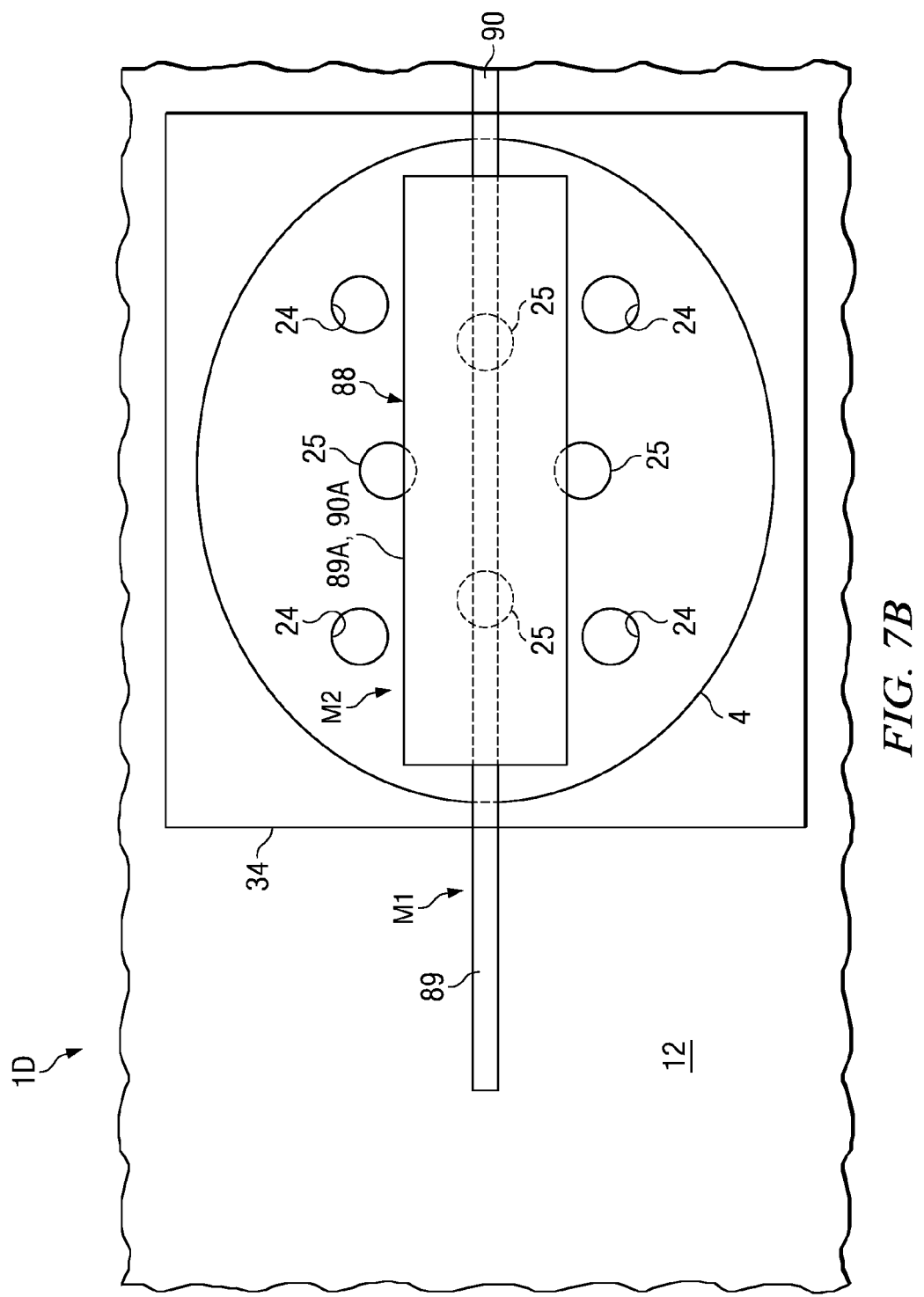
FIG. 7B is a transparent plan view of the integrated circuit shown in FIG. 7A showing the relative alignment of various parts therein.

FIGS. 7A and 7B show simplified section view and plan view diagrams, respectively, of an embodiment of the present invention wherein the parasitic capacitance between the lower plate of a capacitor 88 and the substrate 2 of integrated circuit 1D is greatly reduced by providing cavity 4 directly underneath capacitor 88. In FIGS. 7A and 7B, silicon layer 2, cavity 4, SiO2 pillar 25, dielectric layer 3, passivation layer 12, etchant openings 24, and cover plate 34 may be substantially the same as in above described FIGS. 6A and 6B except that resistor 87 is omitted and instead is replaced by capacitor 88. Capacitor 88 includes an aluminum trace 89 of the M1 metallization layer connected to an enlarged aluminum lower capacitor plate 89A that is also formed in the M1 metallization layer. Capacitor 88 also includes an aluminum trace 90 of the M2 metallization layer connected to an enlarged aluminum upper capacitor plate 90A that is also formed in the M2 metallization layer. Lower capacitor plate 89A and upper capacitor plate 90A both are located directly above cavity 4. Therefore, the parasitic capacitor-to-substrate capacitance between capacitor 88 and silicon layer 2 is much lower than would be the case if cavity 4 were not provided between capacitor 88 and silicon substrate 2. RF circuitry (not shown) containing capacitor 88 therefore may be operable at much higher frequency than if cavity 4 is not present (if the parasitic capacitance actually is the factor which limits the maximum RF frequency).

Figure 8A:
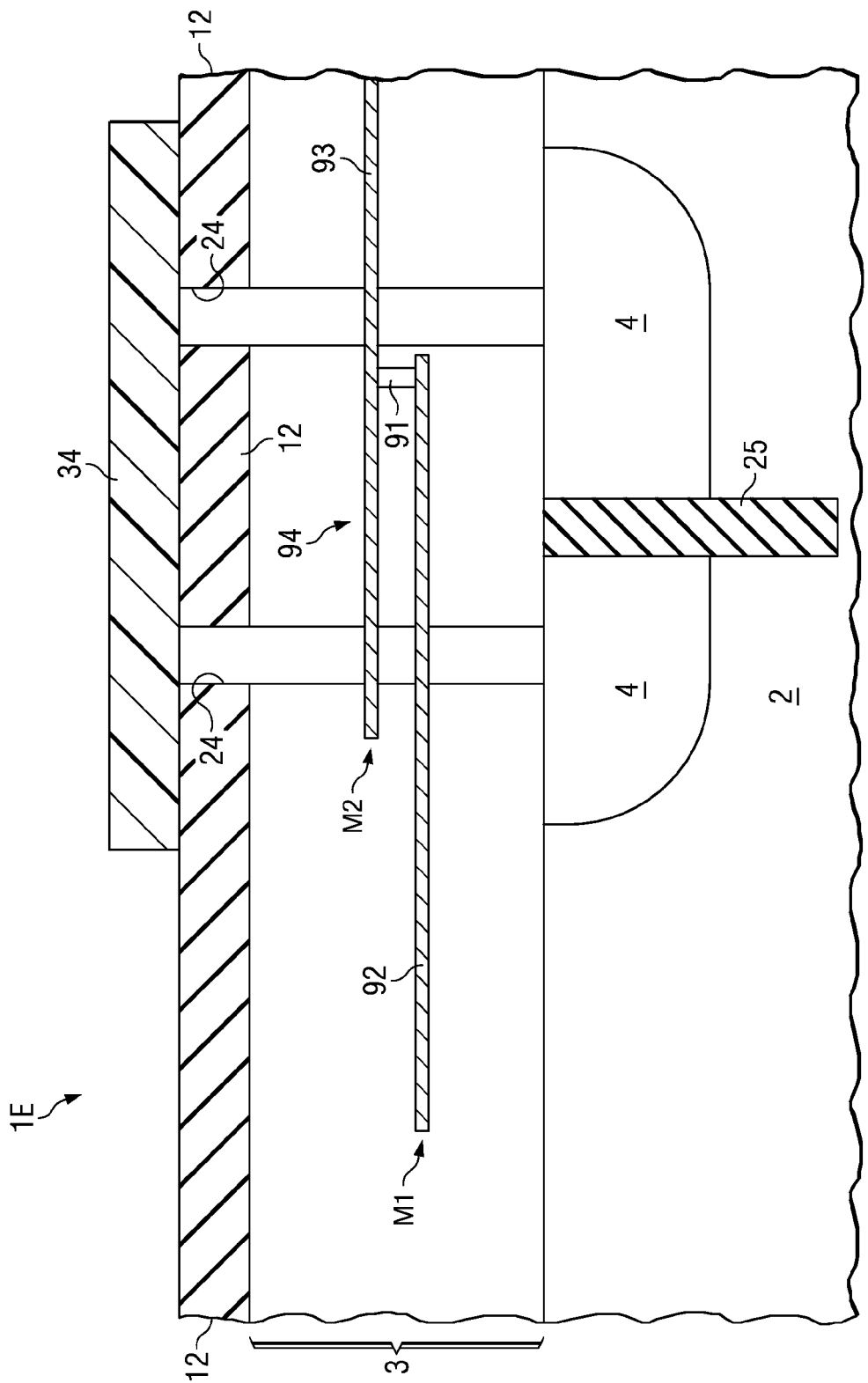
FIG. 8A is a section view of an integrated circuit of the present invention including an inductor having very low inductor-to-substrate parasitic capacitance.
Figure 8B:
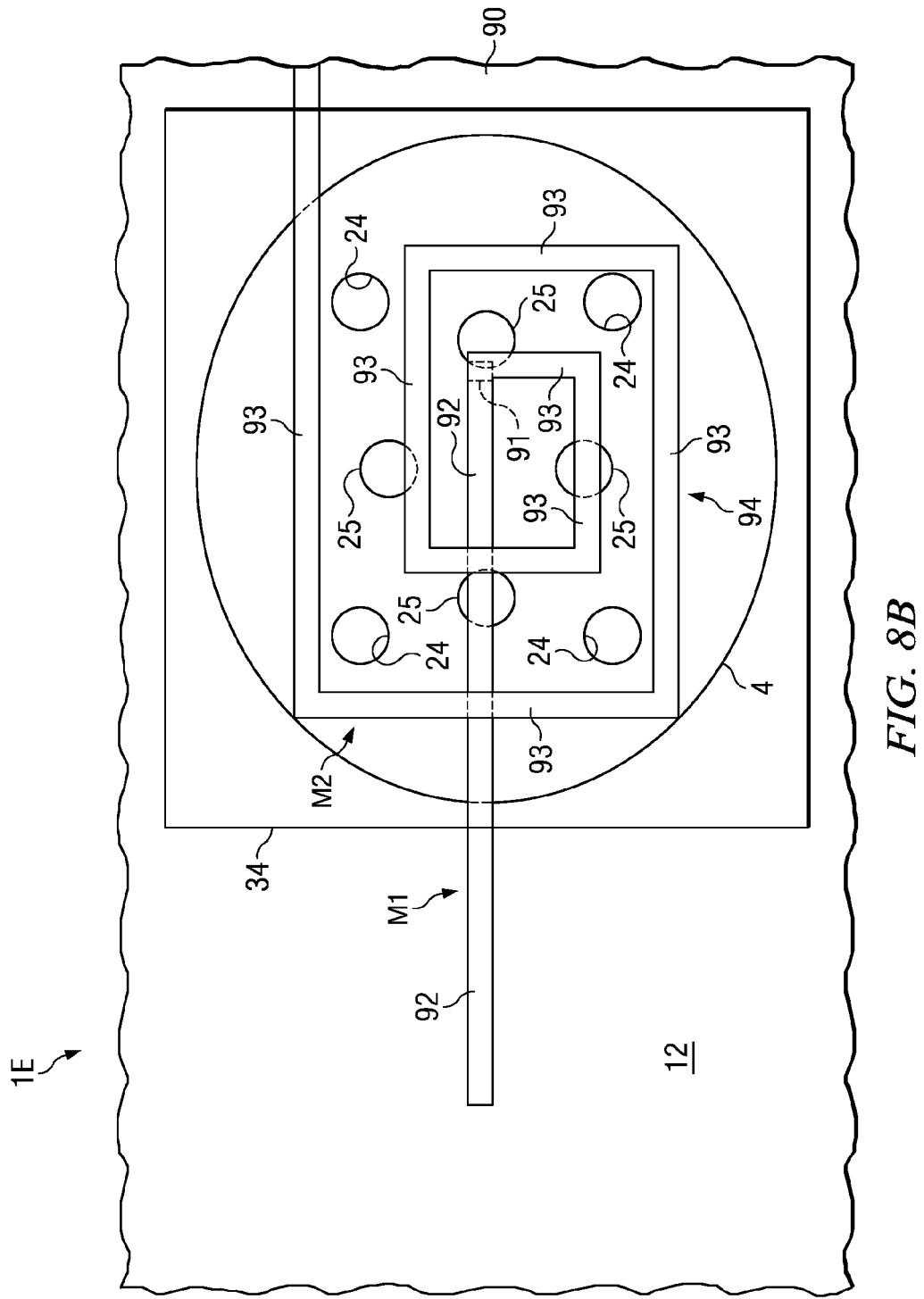
FIG. 8B is a transparent plan view of the integrated circuit shown in FIG. 8A showing the relative alignment of various parts therein.

FIGS. 8A and 8B show simplified section view and plan view diagrams, respectively, of an embodiment of the present invention wherein the parasitic capacitance between an inductor 94 and the substrate 2 of integrated circuit 1E is greatly reduced by providing cavity 4 directly underneath inductor 94. In FIGS. 7A and 7B, silicon substrate 2, cavity 4, SiO2 pillar 25, dielectric layer 3, passivation layer 12, etchant openings 24, and cover plate 34 may be substantially the same as in above described FIGS. 6A and 6B except that resistor 87 is omitted and instead is replaced by inductor 94. Inductor 94 includes an aluminum trace 92 of the M1 metallization layer having an outer end connected to a first terminal of inductor 94 and an inner end connected by a tungsten contact 91 to an inner end of an aluminum trace 93 of the M2 metallization layer. Aluminum trace 93 forms one or more spiral loops and an outer end of aluminum trace 93 extends to a second terminal of inductor 94. Inductor 94 is located directly above cavity 4. Therefore, the parasitic capacitor-to-substrate capacitance between inductor 94 and substrate 2 is much lower than would be the case if cavity 4 were not provided between capacitor 88 and silicon substrate 2. RF circuitry (not shown) containing inductor 94 therefore may be operable at much higher frequency than if cavity 4 is not present (if the parasitic capacitance actually is the factor which limits the maximum RF frequency).

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the invention is applicable to bipolar integrated circuit technology as well as CMOS integrated circuit technology.

The invention claimed is:

1. A method comprising:
   forming a deep trench in a substrate;
   filling the deep trench with a dielectric material;
   forming a dielectric stack over the substrate;
   forming a channel that extends through the dielectric stack; and
   etching the substrate with an etchant introduced through the channel to form a cavity that underlies at least a portion of the dielectric stack and to form a pillar with the dielectric material within the cavity.

2. The method of claim 1, wherein the method further comprises forming a cap layer over the dielectric stack, wherein the cap layer seals the channel.

3. The method of claim 1, wherein the step of forming the dielectric stack further comprises:
   forming a first dielectric layer formed over the silicon layer;
   forming a polysilicon layer formed over the first dielectric layer;
   forming a second dielectric layer formed over the polysilicon layer;
   forming a nitride layer formed over the second dielectric layer;
   forming a third dielectric layer formed over the nitride layer; and
   forming a metallization layer that is formed over the third dielectric layer.

4. The method of claim 3, wherein the metallization layer further comprises a first portion, a second portion, and a third portion, and wherein the step of forming the dielectric stack further comprises forming a thermopile junction by:
   forming a first via that extends between a portion of the polysilicon layer and the first portion of the metallization layer; and
   forming a second via that extends between the portion of the nitride layer and the first portion of the metallization layer.

5. The method of claim 4, wherein the portion of the polysilicon layer further comprises a first portion of the polysilicon layer, and wherein the portion of the nitride layer further comprises a first portion of the nitride layer, and wherein the step of forming the dielectric stack further comprises forming a thermopile junction by:
   forming a third via that extends between the second portion of the polysilicon layer and the second portion of the metallization layer; and
   forming a fourth via that extends between the second portion of the nitride layer and the third portion of the metallization layer.

6. A method comprising:
   forming a deep trench in a silicon layer that extends to a first dielectric layer that underlies the silicon layer;
   filling the deep trench with a dielectric material;
   forming a dielectric stack by:
      forming a second dielectric layer over the silicon layer;
      forming a polysilicon layer over the second dielectric layer;
      pattering the polysilicon layer to form a polysilicon strip;
      forming a third dielectric layer over the polysilicon layer;
      depositing a nitride layer on the third dielectric layer;
      pattering the nitride layer to form a nitride strip;
      forming a fourth dielectric layer over the nitride layer;
      etching the third and fourth dielectric layers to form first, second, third, and fourth opening, wherein the first and second openings extend through the fourth dielectric layer to the nitride layer, and wherein the third and fourth openings extend through the third and fourth dielectric layers to the polysilicon layer;
      forming first, second, third, and fourth vias in the first, second, third, and fourth openings;
      forming a metallization layer over the fourth dielectric layer;
      pattering the metallization layer to form a first portion that is coupled to the first and third vias, a second portion that is coupled the fourth via, and a third portion that is coupled to the second via;
   forming a passivation layer over the dielectric stack;
   forming a plurality of channels that extend through the dielectric stack and the passivation layer to the silicon layer;
   etching the silicon layer with an etchant introduced through the plurality of channels to form a cavity that underlies at least a portion of the dielectric stack and to form a pillar with the dielectric material within the cavity; and
   forming a cap layer over the passivation layer, wherein the cap layer seals the plurality of channels.

7. The method of claim 6, wherein second, third, and fourth dielectric layers are formed of silicon dioxide.

8. The method of claim 7, wherein the metallization layer is formed of aluminum.

9. The method of claim 8, wherein the nitride layer is formed of titanium nitride.

10. The method of claim 9, wherein the first, second, third, and forth vias are formed of tungsten.

11. The method of claim 10, wherein the polysilicon strip is substantially parallel to the nitride strip.

12. The method of claim 11, wherein the method further comprises doping the polysilicon layer with an N-type dopant.

* * * * *